(12) United States Patent
Liu

(10) Patent No.: US 11,901,226 B2
(45) Date of Patent: Feb. 13, 2024

(54) METHOD FOR FORMING AN INTERCONNECT STRUCTURE

(71) Applicant: Taiwan Semiconductor Manufacturing Co., Ltd., Hsinchu (TW)

(72) Inventor: Wen-Kuei Liu, Xinpu Township (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 99 days.

(21) Appl. No.: 17/349,063

(22) Filed: Jun. 16, 2021

(65) Prior Publication Data

US 2021/0313227 A1 Oct. 7, 2021

Related U.S. Application Data

(63) Continuation of application No. 16/438,875, filed on Jun. 12, 2019, now Pat. No. 11,069,570.

(Continued)

(51) Int. Cl.
*H01L 21/768* (2006.01)
*H01L 21/308* (2006.01)
*H01L 21/311* (2006.01)

(52) U.S. Cl.
CPC .... *H01L 21/76877* (2013.01); *H01L 21/3081* (2013.01); *H01L 21/31138* (2013.01);

(Continued)

(58) Field of Classification Search
CPC ............... H01L 29/16; H01L 29/1604; H01L 29/161–167; H01L 21/18–326;
(Continued)

(56) References Cited

U.S. PATENT DOCUMENTS 6,444,584 B1 * 9/2002 Hsiao ................. H01L 21/0276
257/E21.232
6,753,249 B1 * 6/2004 Chen .................... H01L 21/7684
438/645

(Continued)

FOREIGN PATENT DOCUMENTS

CN 1471131 A 1/2004
CN 101733701 A 6/2010
(Continued)

OTHER PUBLICATIONS

Shirakawa, H., et al., *Synthesis of Electrically Conducting Organic Polymers: Halogen Derivatives cf Polyactelyne*, (CH)x, J.C.S. Chem. Comm., pp. 578-580 (1977).

*Primary Examiner* — Victor A Mandala
*Assistant Examiner* — Lawrence C Tynes, Jr.
(74) *Attorney, Agent, or Firm* — Sterne, Kessler, Goldstein & Fox P.L.L.C.

(57) ABSTRACT

The present disclosure relates to a method of forming an interconnect structure. The method can include providing a semiconductor substrate; depositing a photoresist and a BARC layer on the semiconductor substrate; forming an opening in the photoresist and the BARC layer and a portion of the semiconductor substrate; depositing a conductive material to fill the opening; and planarizing the conductive material and the semiconductor substrate.

20 Claims, 5 Drawing Sheets

Related U.S. Application Data

(60) Provisional application No. 62/753,805, filed on Oct. 31, 2018.

(52) U.S. Cl.
CPC .... *H01L 21/7684* (2013.01); *H01L 21/76802* (2013.01); *H01L 21/76846* (2013.01); *H01L 21/76847* (2013.01); *H01L 21/76873* (2013.01)

(58) Field of Classification Search
CPC ........... H01L 21/76877; H01L 21/7684; H01L 21/02381; H01L 21/3081
See application file for complete search history.

(56) References Cited

U.S. PATENT DOCUMENTS

| | | | |
|---|---|---|---|
| 11,069,570 B2 * | 7/2021 | Liu | ................... H01L 21/76877 |
| 2002/0041028 A1 | 4/2002 | Choi et al. | |
| 2005/0274692 A1 | 12/2005 | Hamada et al. | |
| 2006/0153987 A1 | 7/2006 | Kim et al. | |
| 2010/0119979 A1 * | 5/2010 | Rahman | .............. H01L 21/3081 |
| | | | 427/595 |
| 2011/0151376 A1 * | 6/2011 | Rahman | .............. H01L 21/3081 |
| | | | 430/311 |
| 2012/0251956 A1 * | 10/2012 | Rahman | ................ C09D 165/00 |
| | | | 430/311 |
| 2013/0052824 A1 * | 2/2013 | Hagiwara | ........... H01L 21/0276 |
| | | | 438/689 |
| 2015/0155198 A1 * | 6/2015 | Tsai | .................. H01L 21/32133 |
| | | | 438/674 |
| 2015/0162280 A1 | 6/2015 | Pan et al. | |
| 2015/0376807 A1 | 12/2015 | Thorseth et al. | |
| 2019/0035704 A1 | 1/2019 | Pan et al. | |
| 2020/0135555 A1 | 4/2020 | Liu | |

FOREIGN PATENT DOCUMENTS

| | | | | |
|---|---|---|---|---|
| KR | 20140106108 A | * | 9/2014 | ......... H01L 21/3086 |
| TW | 200611075 A | | 4/2006 | |
| TW | 200924057 A | | 6/2009 | |
| WO | WO-0196956 A2 | * | 12/2001 | .............. G03F 7/094 |
| WO | WO-2012131479 A1 | * | 10/2012 | .............. C08G 61/02 |
| WO | WO-2013168610 A1 | * | 11/2013 | .............. C08G 63/00 |

* cited by examiner

METHOD FOR FORMING AN INTERCONNECT STRUCTURE

CROSS-REFERENCE TO RELATED APPLICATIONS

This application is a continuation of U.S. Non-provisional patent application Ser. No. 16/438,875, titled "Method for Forming an Interconnect Structure," filed on Jun. 12, 2019, which claims the benefit of U.S. Provisional Patent Application No. 62/753,805, titled "Method for Forming an Interconnect Structure," filed on Oct. 31, 2018. The entire contents of the aforementioned applications are incorporated by reference herein in their entireties.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Sub-micron multi-level metallization is one of the key technologies for the next generation of ultra large scale integration (ULSI) in semiconductor IC industry. The multi-level interconnects that lie at the heart of this technology require planarization of interconnect features formed in high aspect ratio openings, including contacts, vias, metal interconnect lines, and other features. Reliable formation of these interconnect features is very important to the success of ULSI and to the continued effort to increase circuit density and quality on individual substrates and die.

Metal plating and chemical mechanical polishing (CMP) are two important processes for forming the interconnect features during IC fabrication. Metal plating is a semiconductor manufacturing process in which a thin layer of metal coats a substrate. This can be achieved through electroplating, which requires an electric current, or through electroless plating, which is in autocatalytic chemical process. The CMP process combines chemical removal with mechanical polishing. The CMP process polishes and removes materials from the semiconductor substrate and can be used to planarize surfaces.

BRIEF DESCRIPTION OF THE DRAWINGS

Aspects of the present disclosure are best understood from the following detailed description when read with the accompanying figures. In accordance with the common practice in the industry, various features are not drawn to scale. In fact, the dimensions of the various features can be arbitrarily increased or reduced for clarity of illustration and discussion.

DETAILED DESCRIPTION

Figure 1:
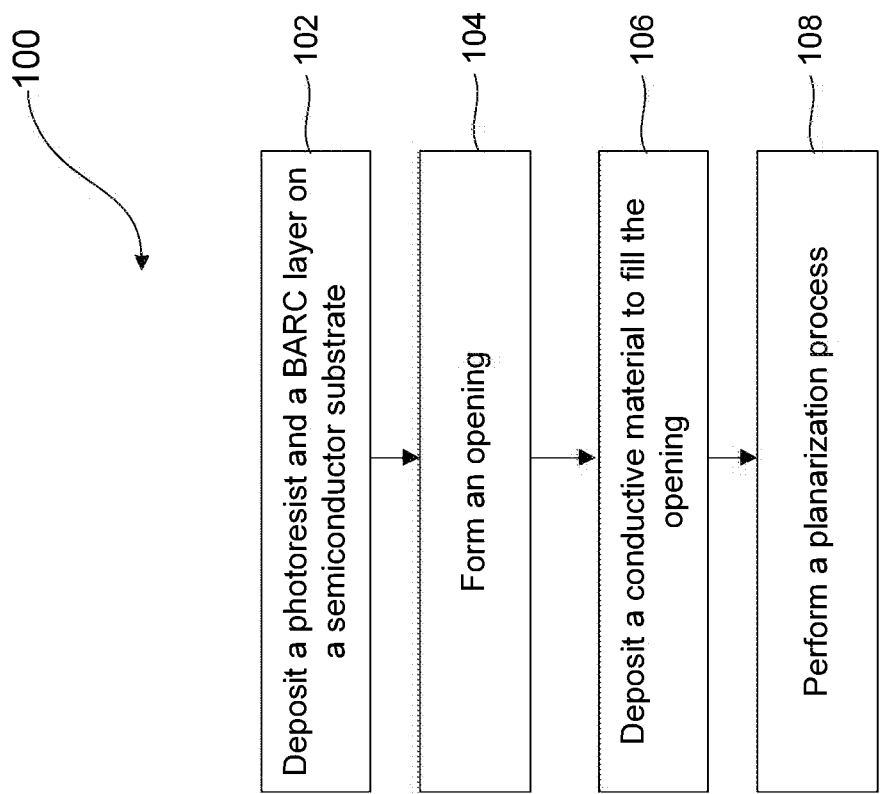
FIG. 1 is a flow chart of a method of forming an interconnect structure, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows can include embodiments in which the first and second features are formed in direct contact, and can also include embodiments in which additional features are disposed between the first and second features, such that the first and second features are not in direct contact. In addition, the present disclosure can repeat reference numerals and/or letters in the various examples. This repetition does not in itself dictate a relationship between the various embodiments and/or configurations discussed.

Further, spatially relative terms, such as "beneath," "below," "lower," "above," "upper," and the like, can be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein can likewise be interpreted accordingly.

The term "nominal" as used herein refers to a desired, or target, value of a characteristic or parameter for a component or a process operation, set during the design phase of a product or a process, together with a range of values above and/or below the desired value. The range of values can be due to slight variations in manufacturing processes or tolerances.

The term "horizontal," as used herein, means nominally parallel to a level ground.

The term "vertical," as used herein, means nominally perpendicular to a level ground.

The terms "substantially" and "about" as used herein indicates the value of a given quantity that can vary based on a particular technology node associated with the subject semiconductor device. In some embodiments, the terms "substantially" and "about" can indicate a value of a given quantity that varies within, for example, ±5% of a target (or intended) value (e.g., ±1%, ±2%, ±3%, ±4%, or ±5% of the target (or intended) value).

Metal plating and CMP are two key processes for forming interconnect features during IC fabrication. To form an interconnect structure (e.g., a metal line, a via, a gate, or work function metal), an opening is formed on a semiconductor substrate using photolithography. Then, a conductive material (e.g., copper, gold, tungsten, or aluminum) is deposited onto the semiconductor substrate to fill the opening by using a metal plating (e.g., electroplating or electroless plating) process. After, a CMP process is performed to planarize the surface of the semiconductor substrate. The CMP process involves placing a semiconductor substrate in a semiconductor substrate carrier in an upside-down position with a surface to be polished (e.g., the surface subject to metal plating) facing towards a polishing pad. The semiconductor substrate carrier and the semiconductor substrate are rotated as a downward pressure is applied to the semiconductor substrate against the polishing pad. A chemical solution, referred to as "a CMP slurry," is deposited onto the surface of the polishing pad to aid in the planarization process. Thus, the surface of the semiconductor substrate can be planarized using a combination of mechanical (grinding) and chemical (CMP slurry) forces.

However, the metal plating process can accumulate excessive loading of metals outside of the opening area and form an uneven surface prior to the CMP process, which decreases CMP efficiency, reduces global planarization, and increases fabrication cost (e.g., increased consumption of CMP polishing pad).

This disclosure is directed to a method of forming an interconnect structure that incorporates deposition and patterning of photoresist/bottom anti-reflective coating (BARC) layer on the semiconductor substrate during the metal plating process. The patterned photoresist/BARC layer covered area has a lower conductivity than those in the opening area without the photoresist/BARC layer. By using the conductivity difference between opening area and other areas (e.g., photoresist/BARC layer covered area), metal plating can achieve a high plating speed at opening areas and a low plating speed at other areas (e.g., above photoresist/BARC layer covered area). This method can reduce incoming loading after metal plating to achieve higher global planarization, improve within wafer/within die (WiD/WiW) loading, and reduce fabrication cost. This method can be implemented to thin film processes (e.g., metal line/via/trench/gate/work function metal depositions).

Figure 2B:
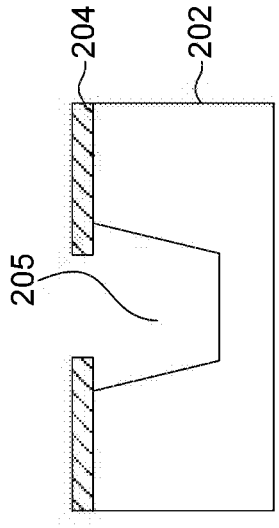
FIGS. 2A-2F are a series of cross-sectional views of partially-fabricated semiconductor structures illustrating a fabrication process for forming an interconnect structure, in accordance with some embodiments of the present disclosure.
Figure 2D:
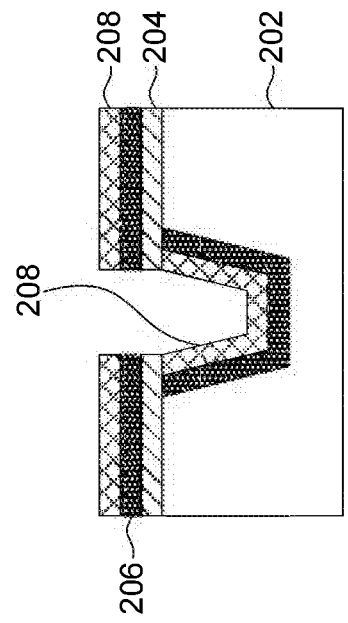
Figure 3:
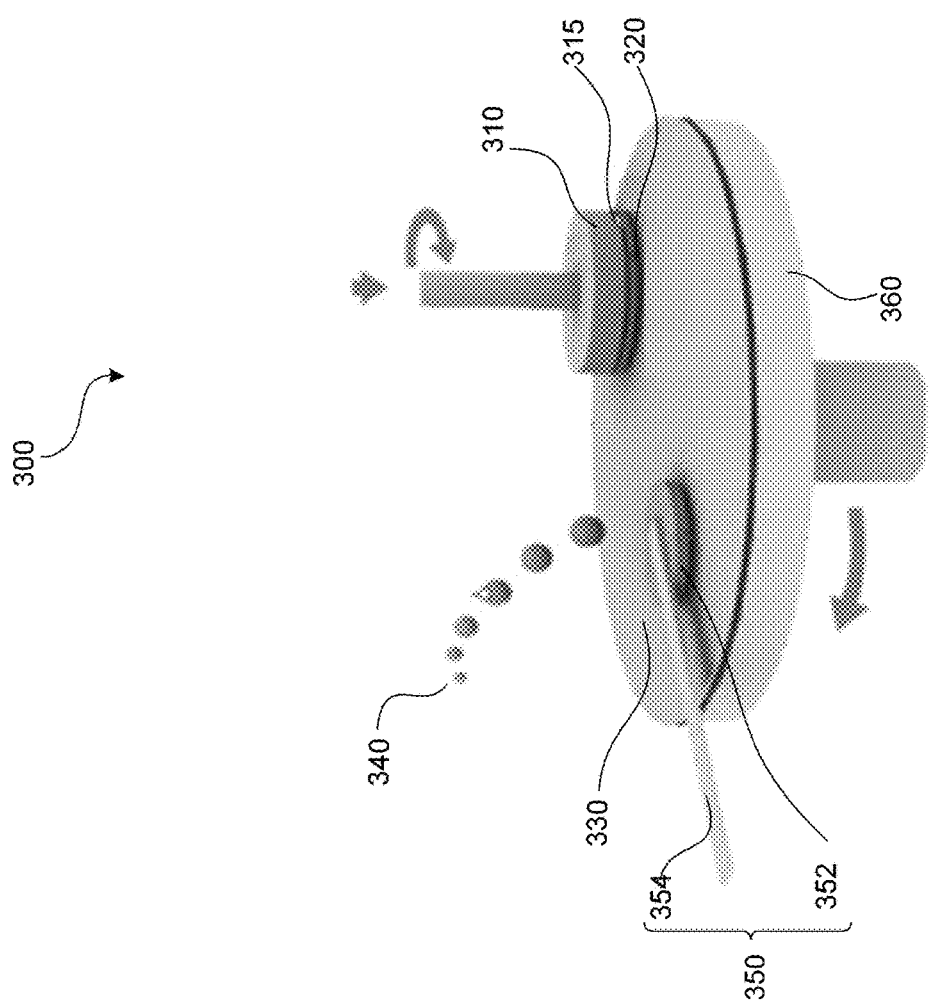
FIG. 3 is a schematic of an exemplary chemical mechanical polishing (CMP) apparatus used in a fabrication process for forming an interconnect structure, in accordance with some embodiments of the present disclosure.
Figure 4:
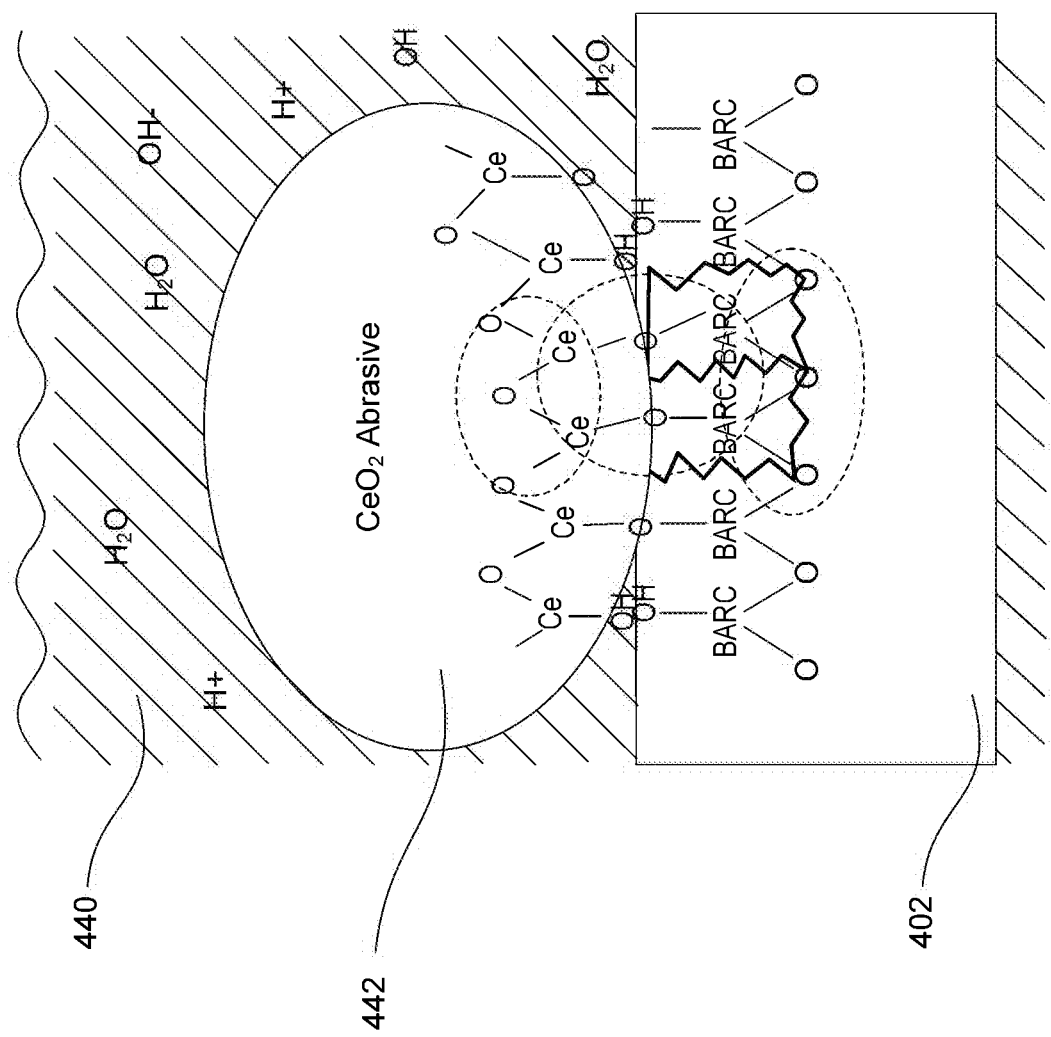
FIG. 4 is a schematic showing a chemical reaction during a CMP process, in accordance with some embodiments of the present disclosure.

FIG. 1 is a flow chart of a method 100 of forming an interconnect structure, in accordance with some embodiments of the present disclosure. FIGS. 2A-2F are a series of cross-sectional views of partially-fabricated semiconductor structures illustrating a fabrication process of forming the interconnect structure, in accordance with some embodiments. FIG. 3 is a schematic of an exemplary CMP apparatus used in a fabrication process of forming the interconnect structure, in accordance with some embodiments of the present disclosure. FIG. 4 is a schematic showing a chemical reaction during the CMP process, in accordance with some embodiments of the present disclosure. Operations shown in method 100 are not exhaustive; other operations can be performed as well before, after, or between any of the illustrated operations. In some embodiments, operations of method 100 can be performed in a different order. Variations of method 100 are within the scope of the present disclosure.

Referring to FIG. 1, method 100 starts at operation 102, in which a photoresist and a BARC layer is deposited on a semiconductor substrate. In some embodiments, the photoresist and the BARC layer is deposited as a single layer (photoresist/BARC layer). In some embodiments, the photoresist and the BARC layer are deposited as two separate layers.

Figure 2A:
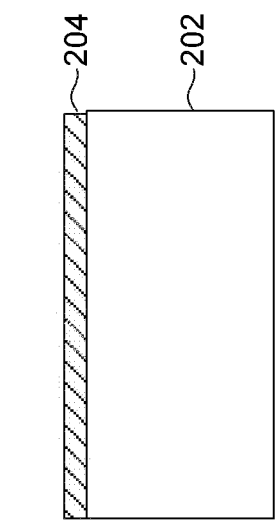

As illustrated in FIG. 2A, a photoresist/BARC layer 204 is deposited on a semiconductor substrate 202. In some embodiments, semiconductor substrate 202 includes a semiconductor body as well as an overlying dielectric material layer (e.g., oxide) and an overlying metal layer. The semiconductor body can include, but is not limited to, silicon, germanium, an III-V semiconductor material (e.g., a combination of one or more group III elements with one or more group V elements). The metal layer can include, but is not limited to, germanium, copper, or aluminum. The dielectric material layer can include, but is not limited to, silicon dioxide.

Semiconductor substrate 202 can be a wafer (e.g., a silicon wafer) and can be (i) a pure element semiconductor including silicon and germanium; (ii) a compound semiconductor including silicon carbide (SiC), gallium arsenide (GaAs), gallium phosphide (GaP), indium phosphide (InP), indium arsenide (InAs), gallium arsenide phosphide (GaAsP), aluminum indium arsenide (AlInAs), aluminum gallium arsenide (AlGaAs), gallium indium arsenide (GaInAs), gallium indium phosphide (GaInP), gallium indium arsenide phosphide (GaInAsP), and indium antimonide (InSb); (iii) an alloy semiconductor including silicon germanium (SiGe); or (iv) a combination thereof. In some embodiments, semiconductor substrate 202 can be a semiconductor on insulator (SOI). In some embodiments, semiconductor substrate 202 can be an epitaxial material.

Prior to deposition of photoresist/BARC layer 204, an optional etch stop layer (not shown in FIGS. 2A-2F) can be formed on semiconductor substrate 202. Etch stop layer can prevent semiconductor substrate 202 from being damaged by a subsequent etching step and simultaneously prevents semiconductor substrate 202 from being oxidized by exposure to an oxygen containing environment. The etch stop layer can be formed by chemical vapor deposition using an etch stop material including, but not limited to, silicon nitride. In some embodiments, a low-k dielectric layer (not shown in FIGS. 2A-2F) can be formed on the etch stop layer. The low-k dielectric layer can include any suitable dielectric material, including, but not limited to, low-k materials having a dielectric constant of about 3.9 or less to insulate one conductive layer from another. Low-k dielectric layer can include interlayer dielectrics (ILDs) or intermetal dielectrics (IMDs). In some embodiments, the low-k dielectric layer can include silicon dioxide. In some embodiments, a primer layer (not shown in FIGS. 2A-2F) can be formed on the semiconductor substrate 202 prior to deposition of photoresist/BARC layer 204. The primer layer can be formed of hexamethyldisilazane (HMDS) and can include a small amount, for example 1%, of trimethylsilyldiethylamine. In some embodiments, HMDS is not deposited prior to deposition of photoresist/BARC layer 204 to prevent photoresist/BARC layer 204 peeling.

In some embodiments, the photoresist and the BARC layer is deposited as a single layer (e.g., photoresist/BARC layer 204). In some embodiments, a photoresist/BARC material for deposition is formed by introducing a conductive chemical structure into a photoresist polymer by a chemical method. For example, the photoresist/BARC material can be formed by oxidation with chlorine (Cl), bromine (Br), or iodine (I). In some embodiments, the photoresist/BARC material can be formed by mixing a conductive material with a photoresist polymer by a physical method. For example, the photoresist/BARC material can be formed by adding metal ions, such as copper (Cu), tungsten (W), aluminum (Al), cobalt (Co) to Cl, Br, or I. The photoresist/BARC material is then deposited on semiconductor substrate 202 as a single photoresist/BARC layer by a deposition method, such as, spin coating. In some embodiments, the photoresist/BARC material can include a polymer material selected from polyimide, polysulfone, polyacetylene, or a combination thereof. The polymer material can be oxidized with chlorine, bromine, or iodine vapor. After deposition of photoresist/BARC layer 204, a baking treatment can be performed at a temperature between about 100° C. and about 1000° C. or between about 205° C. and about 1000° C. In some embodiments, a baking treatment can be performed at a temperature between about 200° C. and about 300° C. (e.g., about 200° C., about 220° C., about 240° C., about 260° C., or about 280° C.) to prevent photoresist/BARC layer peeling due to lower warpage stress. In some embodiments, photoresist/BARC layer 204 has a thickness of from about 0.1 nm to about 100 µm. In some embodiments, photoresist/BARC layer 204 has a thickness of from about 100 nm to about 100 µm (e.g., about 100 nm, about 500 nm, about 1 µm, about 10 µm, about 50 µm, or about 100 µm).

In some embodiments, the photoresist and the BARC layer are deposited as two separate layers. A BARC layer can be deposited over semiconductor substrate 202 prior to depositing a photoresist layer to modify electrical conductivity of the photoresist layer and suppress unintended light reflection from a reflective layer below the photoresist. In some embodiments, the BARC layer can include a resinous polymer, a spin-on glass, a spin-on dielectric, or a CVD dielectric. In some embodiments, the BARC layer (e.g., an organic BARC layer) can be spin coated on semiconductor substrate 202. In some embodiments, the BARC layer can be deposited on semiconductor substrate 202 as a thin layer with a thickness between about 0.1 nm and about 200 nm. After deposition of the BARC layer, a baking treatment can be performed at a temperature between about 100° C. and about 1000° C. In some embodiments, a baking treatment can be performed at a temperature between about 200° C. and about 300° C. (e.g., about 200° C., about 220° C., about 240° C., about 260° C., or about 280° C.) to prevent BARC layer peeling due to lower warpage stress. Next, a photoresist layer is deposited (e.g., by spin coating) on the BARC layer. After deposition of the photoresist layer, a baking treatment can be performed at a temperature between about 100° C. and about 1000° C. or between about 205° C. and about 1000° C. In some embodiments, a baking treatment can be performed at a temperature between about 200° C. and about 300° C. (e.g., about 200° C., about 220° C., about 240° C., about 260° C., or about 280° C.) to prevent photoresist/BARC layer peeling due to lower warpage stress. In some embodiments, the photoresist layer has a thickness between about 0.1 nm and about 100 µm. In some embodiments, the photoresist layer has a thickness of from about 100 nm to about 100 µm (e.g., about 100 nm, about 500 nm, about 1 µm, about 10 µm, about 50 µm, or about 100 µm).

In referring to FIG. 1, method 100 proceeds to operation 104, in which an opening is formed. As illustrated in FIG. 2B, an opening 205 can be formed through photoresist/BARC layer 204 and into a portion of semiconductor substrate 202.

Photoresist/BARC layer 204 can be patterned to define an opening using a photolithographic process. In some embodiments, the photolithographic process is a high resolution (less than 0.25) deep UV (DUV) photolithography for optimum pattern resolution. Patterned photoresist/BARC layer 204 can subsequently be employed as an etch mask in an etch chamber to form opening 205 in semiconductor substrate 202. In some embodiments, the opening defined within photoresist/BARC layer 204 has a diameter between about 0.1 nm and about 10 µm. In some embodiments, a top of opening 205 can have a diameter between about 0.1 nm and about 20 µm or between about 0.1 nm and about 10 µm. In some embodiments, a bottom of opening 205 can have a diameter between about 0.1 nm and about 20 µm or between about 0.1 nm and about 10 µm. In some embodiments, a height of opening 205 can be between about 5 nm and about 20 µm or between about 10 nm and about 10 µm. In some embodiments, a side wall of opening 205 can have an angle between about 45 degrees and about 90 degrees or between about 70 degrees and about 90 degrees with respect to substrate 202. In some embodiments, the opening defined in photoresist/BARC layer 204 can have substantially the same diameter as top or the bottom of opening 205. In some embodiments, due to the over-etching of substrate 202, the opening defined in photoresist/BARC layer 204 can be smaller than the top or the bottom of opening 205.

In some embodiments, the photoresist and the BARC layer are deposited as two separate layers. A photolithographic process can be used to form an opening in the photoresist layer to form a patterned photoresist layer. The patterned photoresist layer can subsequently be employed as an etch mask in an etch chamber to form an opening in the BARC layer and the semiconductor substrate.

Figure 2C:
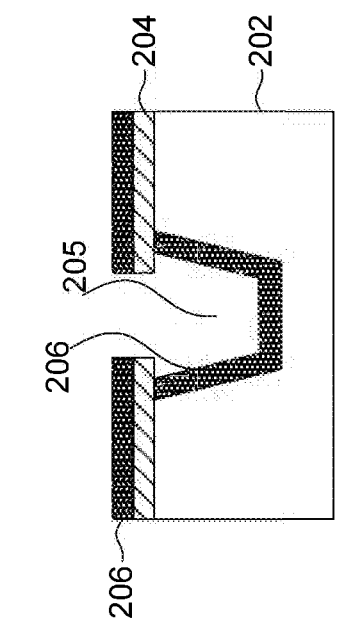
Figure 2F:
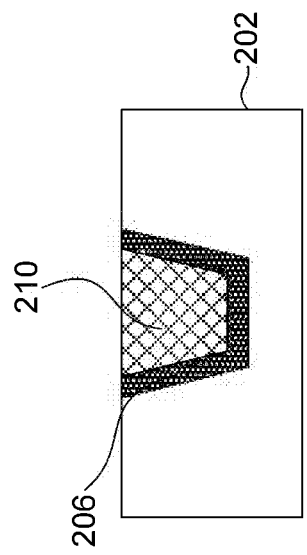

In some embodiments, as illustrated in FIG. 2C, a barrier layer 206 can be deposited on photoresist/BARC layer 204 and in opening 205, to line opening 205 and eliminate potential metal diffusion. Barrier layer 206 can include, but is not limited to, tantalum (Ta), tantalum nitride (TaN), titanium (Ti), titanium nitride (TiN), tungsten nitride (WN), chromium (Cr), chromium nitride (CrN), tantalum-silicon-nitride (TaSiN), titanium-silicon-nitride (TiSiN), and tungsten-silicon-nitride (WSiN). In some embodiments, barrier layer 206 is deposited by plasma enhanced chemical vapor deposition (PECVD). In some embodiments, barrier layer 206 is deposited by atomic layer deposition (ALD). In some embodiments, barrier layer 206 has a thickness between about 200 nm to about 1000 nm (e.g., about 200 nm, about 400 nm, about 600 nm, about 800 nm, or about 1000 nm).

In some embodiments, as illustrated in FIG. 2D, a seed layer 208 can be deposited on barrier layer 206, to enhance bonding between metal layer and semiconductor substrates. Seed layer 208 can include, but is not limited to, Ti, TiN, tungsten titanium (TiW), Ta, TaN, tungsten (W), aluminum (Al), copper (Cu), and palladium (Pd). In some embodiments, seed layer 208 is deposited by physical vapor deposition (PVD) or chemical vapor deposition (CVD). In some embodiments, seed layer 208 has a thickness between about 0.1 nm to about 100 nm. In some embodiments, seed layer 208 has a thickness between about 5 nm and about 50 nm (e.g., about 5 nm, about 10 nm, about 20 nm, about 30 nm, about 40 nm, or about 50 nm).

Figure 2E:
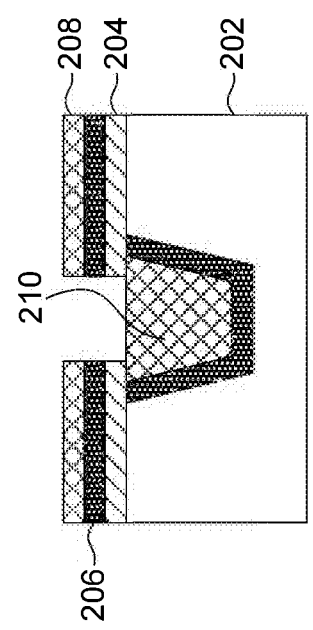

Method 100 proceeds to operation 106, as illustrated in FIG. 1, in which a conductive material is deposited to fill the opening. In some embodiments, depositing the conductive material is performed by using a metal plating process. Metal plating can be performed by electroplating or electroless plating. As illustrated in FIG. 2E, a conductive material 210 is deposited into opening 205 (as shown in FIG. 2D) to fill the opening. In some embodiments, conductive material 210 is deposited into opening 205 by electroplating. Conductive material 210 can include, but is not limited to, Ti, TiN, TiW, Ta, TaN, W, Al, Cu, and Pd.

Electroplating is a process that uses an electric current to reduce dissolved metal cations so that the dissolved metal cations form a thin coherent metal coating on an electrode. Electroplating can also include electrical oxidation of anions on a solid substrate. Electroplating can include an electrodeposition process. The part to be plated (e.g., semiconductor substrate 202) is the cathode of the circuit. In some embodiments, the anode is made of the metal to be plated on semiconductor substrate 202. Both components can be immersed in an electrolyte solution containing one or more dissolved metal salts, as well as other ions, that permit the flow of electricity. A power supply provides a current to the anode, oxidizing the metal atoms that it comprises and allowing them to dissolve in the solution. At the cathode, the dissolved metal ions in the electrolyte solution are reduced at the interface between the solution and the cathode, such that they "plate out" onto the cathode (e.g., semiconductor substrate 202). In some embodiments, the electroplating is performed under a power supply of direct current, alternating current, or a combination thereof. In some embodiments, the electroplating is performed under a power supply between about 1 watt and about 10000 watts. In some embodiments, the electroplating is performed under a power supply between about 10 watts and about 1000 watts (e.g., about 10 watts, about 100 watts, about 200 watts, about 500 watts, or about 1000 watts). In some embodiments, the current density is between about 0.01 A/m and about 10000 A/m. In some embodiments, the current density is between about 10 A/m and about 1000 A/m (e.g., about 10 A/m, about 100 A/m, about 200 A/m, about 500 A/m, or about 1000 A/m). In some embodiments, the voltage is between about 0.01 volt and about 10000 volts. In some embodiments, the voltage is between about 10 volts and about 1000 volts (e.g., about 10 volts, about 100 volts, about 200 volts, about 500 volts, or about 1000 volts). In some embodiments, the electroplating is performed under a metal plating temperature between about 0° C. and about 600° C. In some embodiments, the electroplating is performed under a metal plating temperature between about 100° C. and about 500° C. (e.g., about 100° C., about 200° C., about 300° C., about 400° C., or about 500° C.).

Electroplating can precisely control the thickness and morphology of the deposited conductive material layer by adjusting the electrochemical parameters. Plating speed is correlated with conductivity of the part to be plated. In some embodiments, the conductivity of the seed layer over photoresist/BARC layer 204 is between about 1 and about $99 \times 10^6$ S·m$^{-1}$. In some embodiments, the conductivity of the seed layer in opening 205 is between about 10000 and about $99 \times 10^6$ S·m$^{-1}$. In some embodiments, the ratio of the conductivity of the seed layer in opening 205 to the conductivity of the seed layer over photoresist/BARC layer 204 is between about 100 and about 10000. In some embodiments, the ratio of the conductivity of the seed layer in opening 205 to the conductivity of the seed layer over photoresist/BARC layer 204 is between about 10 and about 1000. The conductivity difference results in good deposition selectivity. In some embodiments, the ratio of the thickness of deposited conductive layer in opening 205 to the thickness of deposited conductive layer over photoresist/BARC layer 204 is between about 10 and about 10000. In some embodiments, the ratio of the thickness of deposited conductive layer in opening 205 to the thickness of deposited conductive layer over photoresist/BARC layer 204 can be between about 10 and about 1000.

In some embodiments, electroplating can also include a pulse electroplating process. Pulse electroplating process involves the swift alternating of the potential or current between two different values resulting in a series of pulses of equal amplitude, duration and polarity, separated by zero current. By changing the pulse amplitude and width, the deposited film's composition and thickness can be changed.

In referring to FIG. 1, method 100 proceeds to operation 108, in which a planarization process is performed. In referring to FIGS. 2E and 2F, the planarization process is performed to remove photoresist/BARC layer 204, barrier layer 206, seed layer 208, and planarize the interconnect structure (e.g., conductive material 210) and semiconductor substrate 202.

In some embodiments, the planarization process is a CMP process performed using a CMP apparatus. FIG. 3 is a schematic of a CMP apparatus 300, in accordance with some embodiments of the present disclosure. CMP apparatus 300 can include a semiconductor substrate carrier 310, a retainer ring 315, a polishing pad 330, a CMP slurry delivery arm (not shown in FIG. 3), a pad conditioner 350 positioned over polishing pad 330, and a platen 360. Semiconductor substrate carrier 310 can be configured to hold and rotate a semiconductor substrate 320. Retainer ring 315 can be configured to reduce lateral movement of semiconductor substrate 320 during the CMP process. Polishing pad 330 can be configured to polish semiconductor substrate 320. In some embodiments, both polishing pad 330 and semiconductor substrate carrier 310 rotate during the CMP process. In some embodiments, only one of polishing pad 330 and semiconductor substrate carrier 310 rotates during the CMP process. The CMP slurry delivery arm can be configured to deliver and dispense a CMP slurry 340 onto polishing pad 330. Pad conditioner 350 can be configured to condition polishing pad 330 (e.g., roughen and texturize the surface of polishing pad 330). Platen 360 can be configured to support and rotate polishing pad 330.

In operation 108, the planarization process (e.g., CMP process) can include securing the semiconductor substrate onto a semiconductor substrate carrier, pressing the semiconductor substrate against a polishing pad, dispensing a CMP slurry onto the polishing pad, and rotating the semiconductor substrate carrier or the polishing pad.

In some embodiments, the semiconductor substrate (e.g., after metal plating) is secured onto a semiconductor substrate carrier (e.g., semiconductor substrate carrier 310 as shown in FIG. 3). The semiconductor substrate is secured in the semiconductor substrate carrier at least partially by a retainer ring (e.g., retainer ring 315 as shown in FIG. 3), which can keep the semiconductor substrate in a predetermined position and prevent detachment of the semiconductor substrate during the CMP process. In some embodiments, a vacuum can be applied to help secure the semiconductor substrate on the semiconductor substrate carrier.

In some embodiments, the semiconductor substrate is pressed against a polishing pad (e.g., polishing pad 330 as shown in FIG. 3). During the CMP process, the polishing pad can be pressed and brought into contact with a surface of the semiconductor substrate at a specific pressure. The pressure with which the semiconductor substrate is pressed against the polishing pad can be determined by moving the semiconductor substrate carrier in a direction perpendicular to a surface of the polishing pad. The retainer ring in the semiconductor substrate carrier is also pressed against the polishing pad. In some embodiments, the pressure (e.g., down force) is between about 0.1 psi and about 100 psi.

In some embodiments, a CMP slurry (e.g., CMP slurry 340 as shown in FIG. 3) is dispensed onto the polishing pad via a CMP slurry delivery arm. The composition of the CMP slurry depends on the type of material on the surface of semiconductor substrate undergoing the CMP process. In some embodiments, the CMP slurry can include a first reactant, an abrasive, a first surfactant, and a solvent. The first reactant can be a chemical that reacts with a material of the semiconductor substrate to assist the polishing pad in grinding away the material, such as an oxidizer. The abrasive can be any suitable particles that, in conjunction with the polishing pad, aids in the planarization of the semiconductor substrate. The first surfactant can be utilized to lower the surface tension of the CMP slurry and disperse the first reactant and the abrasive within the CMP slurry and also prevent or reduce the abrasive from agglomerating during the CMP process. The solvent can be utilized to combine the first reactant, the abrasive, and the first surfactant and allow the mixture to be moved and dispersed onto the polishing pad. In some embodiments, the CMP slurry can include hydrogen peroxide, hydroxylamine, periodic acid, ammonium persulfate, other periodates, iodates, peroxomono, sulfates, peroxymonosulfuric acid, perborates, malonamide, a nitric acid ($HNO_3$), colloidal silica (e.g., silicon oxide), fumed silica, aluminum oxide, cerium oxide, carbon particles, titanium dioxide, polycrystalline diamond, polymethacrylate, polymethacrylic, or a combination thereof. In some embodiments, a flow rate of the CMP slurry from the CMP slurry delivery arm is constant during the CMP process. In some embodiments, the CMP slurry flow rate from the CMP slurry delivery arm is variable. In some embodiments, flow rate of the CMP slurry from the CMP slurry delivery arm is between about 1 ml/min and about 1000 ml/min. In some embodiments, prior to the CMP process of the semiconductor substrate, time is allotted to warm the polishing pad and facilitate flow of polishing slurry from a CMP slurry container to the CMP slurry delivery arm. This can enhance polishing uniformity across multiple semiconductor substrates polished using the CMP apparatus (e.g., CMP apparatus 300 as shown in FIG. 3).

FIG. 4 is a schematic showing the chemical reaction between the CMP slurry and the semiconductor substrate during the CMP process, in accordance with some embodiments of the present disclosure. $H^+$ and $OH^-$ in water in slurry 440 can unite the surface of abrasive 442 (e.g., cerium oxide ($CeO_2$)) with semiconductor substrate 402. A chemical reaction occurs between $CeO_2$ and the surface of semiconductor substrate 402: —Ce—OH+—O-BARC-→Ce—O-BARC+$H_2O$. Bonds produced by hydration reaction are broken during the chemical reaction. The surface of semiconductor substrate 402 unites with the $CeO_2$ surface through oxygen atom, which promotes material removal and the semiconductor substrate planarization.

In some embodiments, the semiconductor substrate carrier or the polishing pad is rotated and/or translated. In some embodiments, the semiconductor substrate carrier rotates with respect to the polishing pad. In some embodiments, the semiconductor substrate carrier is translated with respect to the polishing pad. A rate of movement of the semiconductor substrate carrier can be constant or variable. The semiconductor substrate carrier can remain stationary. Alternatively, the polishing pad can rotate with respect to the semiconductor substrate carrier. A direction of rotation of the polishing pad can be opposite to a direction of rotation of the semiconductor substrate carrier. Further, the polishing pad can have a rate of rotation equal to, or different from, a rate of rotation of the semiconductor substrate carrier. The polishing pad can be several times the diameter of the semiconductor substrate and the semiconductor substrate is kept off-center on the polishing pad during the CMP process to prevent polishing a non-planar surface onto the semiconductor substrate. The semiconductor substrate can also be rotated (e.g., by a rotatable shaft) to prevent polishing a taper into the semiconductor substrate. Although the axis of rotation of the semiconductor substrate and the axis of rotation of polishing pad are not co-linear, the axes are parallel. In some embodiments, the rotation rate of the polishing pad is between about 10 and about 300 rpm.

In some embodiments, a CMP stop layer can be deposited on semiconductor substrate 202 prior to the deposition of photoresist/BARC layer 204. The CMP stop layer can include, but is not limited to, Ti, TaN, TiN, ruthenium (Ru), cobalt (Co), carbon (C), silicon nitride ($SiN_x$), silicon oxide ($SiO_x$), or a combination thereof. In some embodiments, the CMP stop layer has a thickness between about 0.1 nm and about 50 nm. In some embodiments, the CMP stop layer has a thickness between about 1 nm and about 20 nm (e.g., about 1 nm, about 5 nm, about 10 nm, about 15 nm, or about 20 nm). In some embodiments, slurry selectivity of the photoresist/BARC layer to the CMP stop layer is between about 0.01 and about 2000. In some embodiments, slurry selectivity of the photoresist/BARC layer to the CMP stop layer is between about 0.01 and about 0.5 (e.g., about 0.01, about 0.02, about 0.05, about 0.1, about 0.2, or about 0.5). In some embodiments, slurry selectivity of the photoresist/BARC layer to the CMP stop layer is between about 5 and about 1000 (e.g., about 5, about 10, about 100, about 200, about 500, or about 1000). In some embodiments, the CMP process stops in/on the photoresist/BARC layer. In some embodiments, the CMP process stops in/on the CMP stop layer.

In some embodiments, the polishing pad is conditioned with a pad conditioner (e.g., pad conditioner 350 as shown in FIG. 3). The polishing pad, which has a porous structure and a rough polishing surface, can become smooth with a decreased surface roughness. To maintain the polishing rate, the polishing pad needs to be conditioned to maintain the surface roughness. The pad conditioner can include a conditioning disk (e.g., conditioning disk 352 as shown in FIG. 3) configured to roughen a surface of the polishing pad, and a conditioning arm (e.g., conditioning arm 354 as shown in FIG. 3) configured to translate and rotate the conditioning disk.

In some embodiments, performing the planarization process can include a photoresist/BARC removal process. In some embodiments, performing the planarization process can include a photoresist/BARC removal process without a CMP process. The photoresist/BARC removal process can include a dry etch back process and/or a wet stripping process of photoresist/BARC layer 204.

The dry etch back process can include a plasma etching. Plasma etchers can operate in several modes by adjusting the parameters of the plasma. The plasma produces energetic free radicals, neutrally charged, that react at the surface of the semiconductor substrate. The etching gas for the plasma can include oxygen, nitrogen, hydrogen, or a combination thereof. The etching gas can flow at a flow rate between about 1 ml/min and about 2000 ml/min. The plasma etching can be performed under a pressure between about 1 mTorr and about 100 mTorr. The source power can be between about 1 watt and about 5000 watts. The bias power can be between about 1 watt and about 500 watts. In some embodiments, plasma etching is performed under a temperature between about 280° C. and about 1000° C.

The dry etch back process can also include ion milling, reactive-ion etching, deep reactive-ion etching, or a combination thereof. Ion milling, or sputter etching, uses lower pressures (e.g., as low as $10^{-4}$ Torr). Ion milling bombards the wafer with energetic ions of noble gases (e.g., $Ar^+$), which knock atoms from the substrate by transferring momentum. Reactive-ion etching operates under conditions intermediate between sputter and plasma etching (between $10^{-3}$ and $10^{-1}$ Torr). Deep reactive-ion etching can modify the reactive-ion etching technique to produce deep, narrow features. In some embodiments, the dry etch back can remove a thickness between about 0.1 nm and about 200 nm.

The present disclosure provides a method of forming an interconnect structure that incorporates deposition and patterning of photoresist/bottom anti-reflective coating (BARC) layer on the semiconductor substrate prior to a metal plating process. The photoresist/BARC layer reduces conductivity. By using a conductivity difference between openings and other areas (e.g., areas covered with photoresist/BARC layer), metal plating can achieve a high plating speed in openings and a low plating speed at areas surrounding the openings (e.g., above photoresist/BARC layer covered area). This method can reduce incoming loading after metal plating to achieve higher global planarization after a planarization process (e.g., CMP process), improve productivity, and reduce fabrication cost.

Various embodiments in accordance with the present disclosure provide a method of forming an interconnect structure. The method can include providing a semiconductor substrate; depositing a photoresist and a BARC layer on the semiconductor substrate; forming an opening in the photoresist and the BARC layer and a portion of the semiconductor substrate; depositing a conductive material to fill the opening; and planarizing the conductive material and the semiconductor substrate.

In some embodiments, a method includes depositing a photoresist and a BARC layer on a semiconductor substrate; forming an opening in the photoresist and the BARC layer and the semiconductor substrate; depositing, via an electroplating process, a conductive material in the opening; and planarizing the semiconductor substrate.

In some embodiments, a method of planarizing a substrate includes depositing a photoresist and a BARC layer on a substrate; depositing a barrier layer and a seed layer on the substrate; forming an interconnect structure in a portion of the substrate by depositing a conductive material to fill an opening structure on the substrate; and performing a CMP process to planarize the interconnect structure and the substrate.

It is to be appreciated that the Detailed Description section, and not the Abstract of the Disclosure, is intended to be used to interpret the claims. The Abstract of the Disclosure section can set forth one or more but not all exemplary embodiments contemplated and thus, are not intended to be limiting to the subjoined claims.

The foregoing disclosure outlines features of several embodiments so that those skilled in the art can better understand the aspects of the present disclosure. Those skilled in the art will appreciate that they can readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they can make various changes, substitutions, and alterations herein without departing from the spirit and scope of the subjoined claims.

What is claimed is:

1. A method, comprising:
    forming a photoresist comprising a bottom anti-reflective coating (BARC) material by introducing a conductive material into a photoresist polymer;
    depositing, on a semiconductor substrate, the photoresist comprising the BARC material to form a photoresist layer;
    forming an opening in the photoresist layer and a portion of the semiconductor substrate;
    depositing a conductive material in the opening and over the photoresist layer; and
    planarizing the conductive material and the semiconductor substrate.

2. The method of claim 1,
    wherein depositing the photoresist comprises spin coating the photoresist comprising the BARC material.

3. The method of claim 1, further comprising:
    forming the photoresist comprising the BARC material by oxidizing the photoresist polymer with chlorine, bromine, or iodine vapor, wherein depositing the photoresist comprises spin coating the photoresist comprising the BARC material.

4. The method of claim 1, further comprising:
    forming the photoresist comprising the BARC material by adding metal ions to chlorine, bromine, or iodine in the photoresist polymer, wherein depositing the photoresist comprises spin coating the photoresist comprising the BARC material.

5. The method of claim 4, wherein the metal ions comprise copper, tungsten, aluminum, or cobalt.

6. The method of claim 1, further comprising:
    depositing a barrier layer and a seed layer on the photoresist layer and in the opening.

7. The method of claim 1, wherein planarizing the conductive material and the semiconductor substrate comprises removing the photoresist layer, performing a chemical mechanical polishing (CMP) process, or a combination thereof.

8. The method of claim 7, wherein removing the photoresist layer comprises performing a plasma etching process by an etching gas selected from oxygen, nitrogen, hydrogen, or a combination thereof.

9. A method, comprising:
    forming a photoresist comprising a bottom anti-reflective coating (BARC) material by introducing a conductive material into a photoresist polymer;
    disposing the photoresist comprising the BARC material on a semiconductor substrate to provide a photoresist and a BARC layer;
    forming an opening in the photoresist and the BARC layer and the semiconductor substrate;
    electroplating a conductive material in the opening and over the photoresist and the BARC layer; and
    planarizing the semiconductor substrate.

10. The method of claim 9, wherein disposing the photoresist and the BARC layer on the semiconductor substrate comprises disposing the photoresist and the BARC layer as a single layer.

11. The method of claim 9, wherein disposing the photoresist and the BARC layer on the semiconductor substrate comprises disposing the photoresist and the BARC layer as two separate layers.

12. The method of claim 9, wherein electroplating the conductive material comprises performing an electroplating process at a temperature between about 0° C. and about 600° C.

13. The method of claim 9, wherein electroplating the conductive material comprises performing an electroplating process with a current density between about 0.01 A/m and about 10000 A/m and a voltage between about 0.01 volt and about 10000 volts.

14. A method, comprising:
forming a photoresist comprising a bottom anti-reflective coating (BARC) material by introducing a conductive material into a photoresist polymer;
disposing, on a substrate, a photoresist layer comprising the photoresist comprising the BARC material;
removing a portion of the substrate and the photoresist layer on the portion of the substrate to form a trench;
disposing a barrier layer and a seed layer over the photoresist layer and in the trench;
forming an interconnect structure over the barrier layer and the seed layer and in the trench; and
planarizing the interconnect structure and the substrate.

15. The method of claim 14, wherein disposing the photoresist layer comprises spin coating the photoresist comprising the BARC material.

16. The method of claim 14, further comprising:
forming the photoresist comprising the BARC material by oxidizing the photoresist polymer with chlorine, bromine, or iodine vapor, wherein disposing the photoresist layer comprises spin coating the photoresist comprising the BARC material.

17. The method of claim 14, further comprising:
forming the photoresist comprising the BARC material by adding metal ions to chlorine, bromine, or iodine in the photoresist polymer, wherein disposing the photoresist layer comprises spin coating the photoresist comprising the BARC material.

18. The method of claim 17, wherein the metal ions comprise copper, tungsten, aluminum, or cobalt.

19. The method of claim 14, wherein planarizing the interconnect structure and the substrate comprises removing the photoresist layer, performing a chemical mechanical polishing (CMP) process, or a combination thereof.

20. The method of claim 19, wherein removing the photoresist layer comprises performing a plasma etching process with an etching gas selected from oxygen, nitrogen, hydrogen, or a combination thereof.

* * * * *